United States Patent [19]

May et al.

[11] Patent Number: 5,880,687
[45] Date of Patent: Mar. 9, 1999

[54] CASCADED INTEGRATOR-COMB INTERPOLATION FILTER

[75] Inventors: Michael R. May; Carlos A. Greaves, both of Austin, Tex.

[73] Assignee: Motorola Inc., Austin, Tex.

[21] Appl. No.: 806,271

[22] Filed: Feb. 25, 1997

[51] Int. Cl.$^6$ .................................................. H03M 3/00
[52] U.S. Cl. ........................................................... 341/61
[58] Field of Search ................................. 341/143, 61

[56] References Cited

U.S. PATENT DOCUMENTS

| | | | |
|---|---|---|---|
| 5,592,517 | 1/1997 | Camp et al. | 364/724.1 |
| 5,606,319 | 2/1997 | Yatim et al. | 341/61 |
| 5,731,769 | 3/1998 | Girardeau, Jr. et al. | 341/61 |

OTHER PUBLICATIONS

Crocherre et al., *Interpolation and Decimation of Digital Signals—A Tutorial Review*, Proceedings of the IEEE vol. 69 pp. 200–331, Mar. 1981.

Chu et al., *Multriate filter Designs Using Comb Filters*, IEEE Transactions on Circuits and Systems, vol. CAS–31, pp. 913–924, Nov. 1984.

E. B. Hogenauer; "An Economical Class of Digital Filters for Decimation and Interpolation"; IEEE Transactions on Acoustics, Speech, and Signal Processing: vol. ASSP–29, No.2, pp. 155–162 (1981).

*Primary Examiner*—Howard L. Williams
*Attorney, Agent, or Firm*—Daniel D. Hill; Craig J. Yudell

[57] ABSTRACT

A cascaded integrator-comb (CIC) interpolation filter is included within a digital-to-analog converter (138) and includes two up-samplers (150, 164). The two up-samplers (150, 164) also include a sample-and-hold function. The first up-sampler (150) up-samples an output of a differentiator (140). The second up-sampler (164) up-samples an output of an integrator (152) This reduces the area and power requirements of the CIC interpolation filter, while providing approximately the same filtering performance in the pass band and transition band. The total over-sample ratio of the CIC interpolation filter is equal to the first up-sampling ratio multiplied by the second up-sampling ratio. The stop band requirements of the CIC interpolation filter determines the relative sizes of the first and second up-sampling ratios.

27 Claims, 6 Drawing Sheets

FIG.6 ns filter that performs two up-sampling operations. A fraction of the up-sampling operation occurs after the differentiation operation and the balance of the up-sampling occurs at the end of the integration operation. This reduces the area and power requirements of the CIC interpolation filter, while providing

CASCADED INTEGRATOR-COMB INTERPOLATION FILTER

FIELD OF THE INVENTION

This invention relates generally to interpolation filters, and more particularly, to cascaded integrator-comb interpolation filter.

BACKGROUND OF THE INVENTION

The design of a sigma delta digital-to-analog (D/A) converter requires an interpolating filter that reduces the images of the signal at the input of the digital modulator. A cascaded integrator-comb (CIC) interpolating filter is a type of digital linear phase finite impulse response (FIR) filter which can be used in a sigma delta D/A converter to perform filtering and interpolating functions. In contrast to a CIC decimation filter of a sigma delta analog-to-digital (A/D) converter, the digital filtering requirements of the sigma delta D/A converter may be governed more by the system's power spectral density specification than by the need to filter quantization noise. Cascaded CIC interpolation filters are often used to perform this interpolating/filtering function because they are simple and economical (no multipliers are required). As the interpolating rate increases, however, the CIC filter digital word width grows rapidly.

Figure 1:
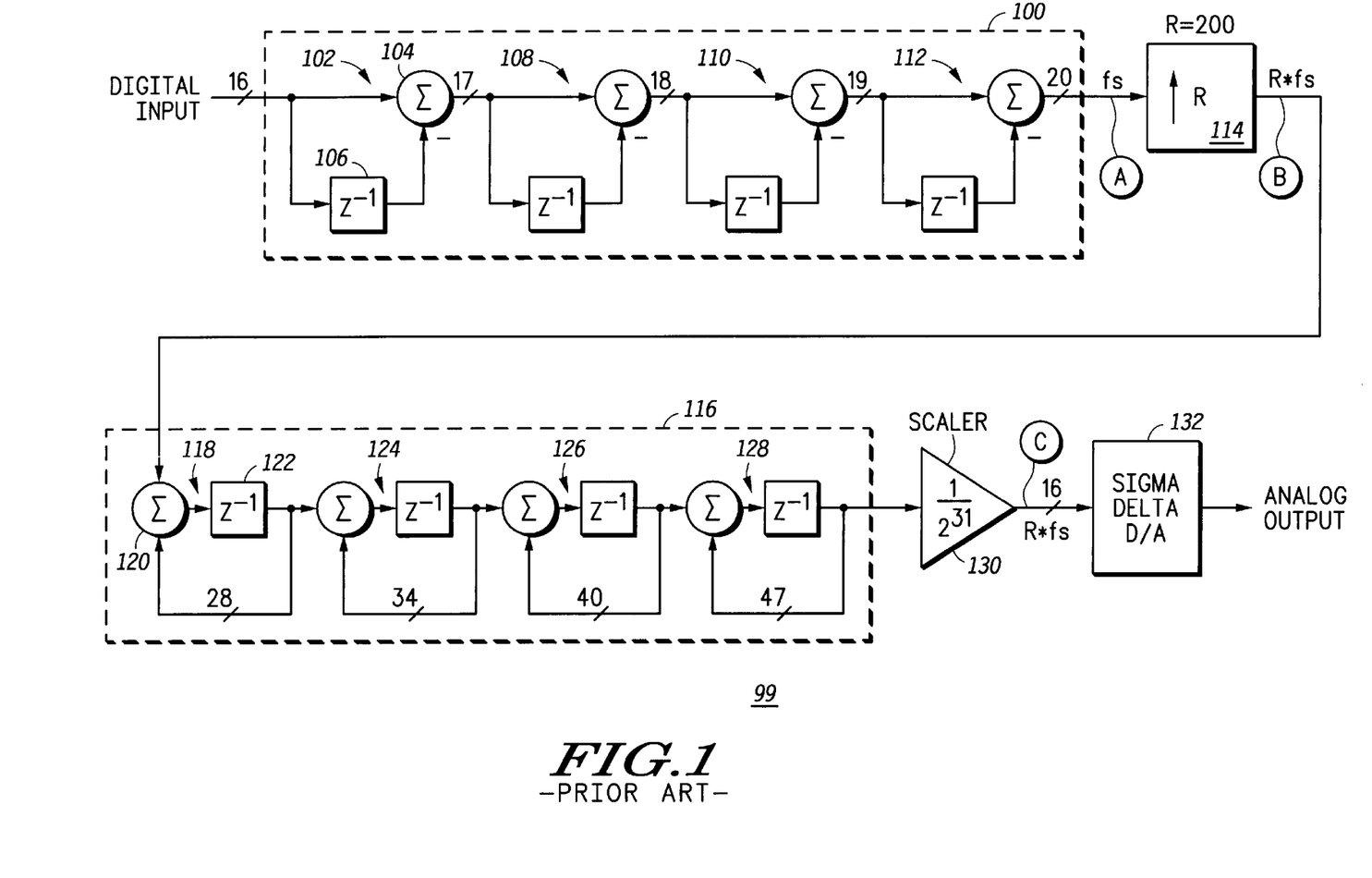
FIG. 1 illustrates, in partial block diagram form and partial logic diagram form, a D/A converter having a CIC interpolation filter in accordance with the prior art.

FIG. 1 illustrates, in partial block diagram form and partial logic diagram form, a D/A converter 99 having a CIC interpolation filter in accordance with the prior art. D/A converter 99 includes a differentiator 100, an up-sampler 114, an integrator 116, a scalar 130, and a sigma delta D/A converter 132. The CIC interpolation filter portion of D/A converter 99 includes differentiator 100, up-sampler 114, and integrator 116. Differentiator 100 is a fourth order differentiator and includes stages 102, 108, 110, and 112. Stage 102 includes delay element 106 and adder 104. The other differentiator stages are substantially the same as stage 102. Differentiator stage 102 is a conventional differentiator which subtracts a delayed version of a digital word labeled "DIGITAL INPUT" from the DIGITAL INPUT and provides a difference output to the next stage of differentiator 100. The number of output bits between each of the stages increases because the digital word width is growing after each differentiation. The increased width of each subsequent differentiator stage is necessary to avoid overflow and retain accuracy during the differentiation. The output of differentiator 100 is provided to an input of up-sampler 114. Up-sampler 114 up-samples the sample frequency ($f_s$) at a rate labeled "R" and provides an output to the input of integrator 116 having a frequency of $R*f_s$.

The operation of D/A converter 99 can be better understood with reference to FIGS. 2–1 through 2–3. FIGS. 2–1 through 2–3 illustrate waveforms of various signals of prior art D/A converter 99 of FIG. 1. Note that $f_s$ is the sample frequency of differentiator 100. The variable R is the integer rate change factor and can be any number. Illustrated in FIG. 2–1 is the output of differentiator 100 labeled "A", and corresponds with the output of differentiator 100 illustrated in FIG. 1. The output of up-sampler 114 is labeled "B" and is illustrated in FIG. 2–2. The waveform B in FIG. 2—2 illustrates the frequency response of the output of up-sampler 114. The up-sampling operation causes the spectral energy from 0 to $f_s$ to replicate at intervals of $f_s$ to R times $f_s$, where R is the up-sampling ratio. Because up-sampler 114 also includes a sample-and-hold circuit, the spectral images at intervals of $f_s$ are multiplied by a sin(x)/x function, where the zeros of the sin(x)/x function will occur at a multiple of the sample frequency $f_s$. The number of bits entering up-sampler 114 is 20. FIG. 1 illustrates the case where R=200. If R equals 200, an 8 bit increase in the number of bits from the input of up sampler 114 to the input of integrator 116 is necessary.

Integrator 116 includes integrator stages 118, 124, 126, and 128. Stage 118 includes delay element 122 and adder 120. Each of the subsequent integrator stages are substantially the same as integrator state 118. As with differentiator 100, a number of bits need to be added from one stage to the next to avoid overflow and retain accuracy. By the time the output of integrator 116 is reached, a total of 47 bits are required, and are provided to an input of scalar 130. The 47 bit register and all of the registers from each of the previous stages are being clocked at a rate equal to R times frequency $f_s$.

Figure 23:
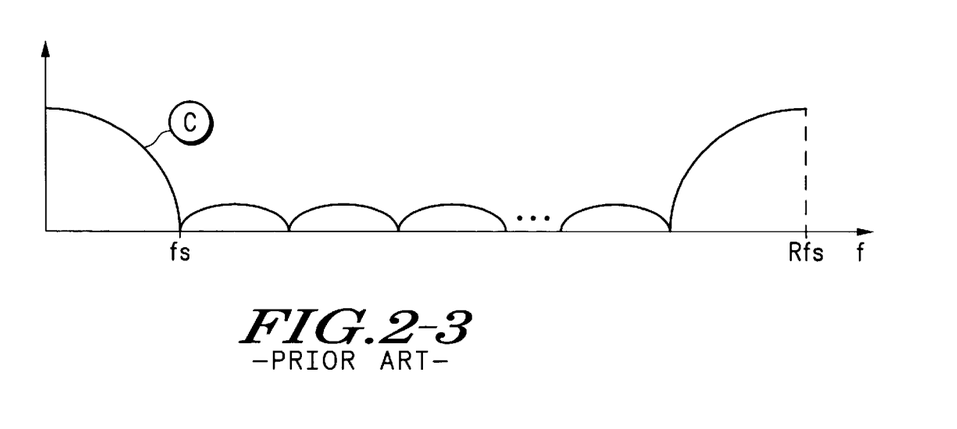
Figure 41:
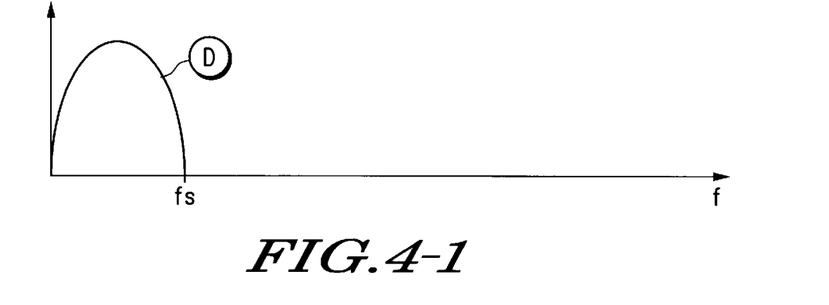
Figure 42:
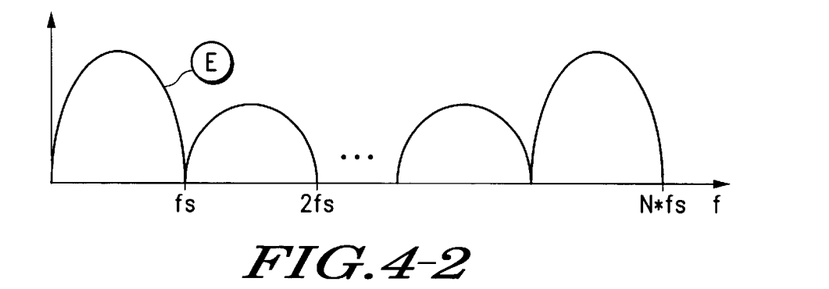

Scalar 130 is used to reduce the number of bits from integrator 116 to 16 bits. The output of scalar 130 is labeled "C" and is illustrated in FIG. 2–3. Scalar 130 is implemented as a 31 bit shift left in the illustrated embodiment. Sigma delta D/A converter 132 performs a conventional D/A conversion to provide an output labeled "ANALOG OUTPUT".

A problem with CIC interpolating filter 99 is that, by clocking the integrator 116 at a very high rate with a large number of bits, implementation problems occur because of the large number of bits required for each the adders for each integration stage. For example, for R=200, the adder of stage 128 must be 47 bits wide, the adder of stage 126 is 40 bits wide, the adder of stage 124 is 34 bits wide, and the adder of stage 118 is 28 bits wide. Also, operating these large adders at a high frequency consumes a large amount of power. In addition, implementing integrator 116 with large adders requires a relatively large surface area of an integrated circuit having CIC interpolating filter 99, which increases manufacturing costs and the size of the integrated circuit. In addition, when R=200, the frequency of the output of integrator 116 will be 200 times $f_s$. Therefore, integrator 116 should be implemented in a very high speed process which can be very expensive to manufacture.

BRIEF DESCRIPTION OF THE DRAWINGS

FIGS. 2–1 through 2–3 illustrate waveforms of various signals of the prior art D/A converter of FIG. 1.

FIGS. 4–1 through 4—4 illustrate waveforms of various signals in the D/A converter of FIG. 3.

DESCRIPTION OF A PREFERRED EMBODIMENT

Generally, the present invention provides a cascaded integrator-comb (CIC) interpolation filter that performs two up-sampling operations. A fraction of the up-sampling operation occurs after the differentiation operation and the balance of the up-sampling occurs at the end of the integration operation. This reduces the area and power requirements of the CIC interpolation filter, while providing approximately the same filtering performance in the pass band and transition band. Only a small amount of degradation is provided in the stop band. This is possible because, for a larger over-sampling ratio, the attenuation of a CIC interpolation filter in the pass band to stop band transition region is a weak function of the up-sampling ratio between the differentiators and integrators of the filter. Because the sigma delta demodulator's signal to noise requirement sets the composite over-sample ratio in a communications system, the digital modulator has to clock at the first up-sampling ratio multiplied by the second up-sampling ratio multiplied by the input data rate (M*N*$f_s$). The stop band requirements of the interpolating filter then determine the relative sizes of M and N. As M increases, the stop band performance becomes less optimal. M should be chosen as large as possible to reduce the size of the integrators while still meeting the stopband attenuation specification of the interpolator. The present invention will be more fully described with reference to FIGS. 3 through 6.

Figure 3:
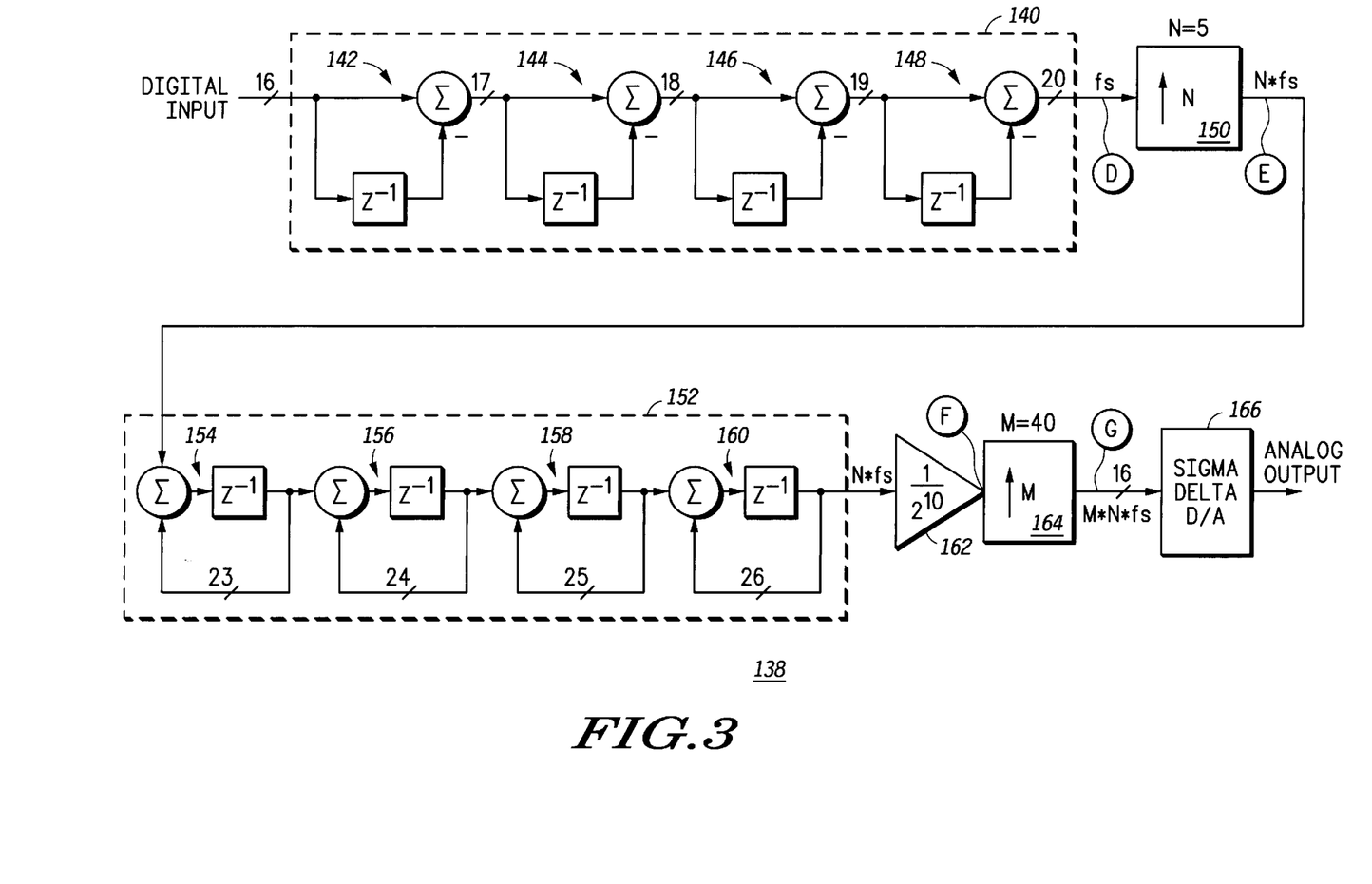
FIG. 3 illustrates, in partial logic diagram form and in partial block diagram form, a D/A converter having a CIC interpolation filter in accordance with the present invention.

FIG. 3 illustrates, in partial logic diagram form and in partial block diagram form, a D/A converter 138 having a CIC interpolation filter in accordance with the present invention. D/A converter 138 includes differentiator 140, first up-sampler 150, integrator 152, scalar 162, second up-sampler 164, and sigma delta D/A 166. The CIC interpolation filter portion includes differentiator 140, first up-sampler 150, and integrator 152. Differentiator 140 includes differentiator stages 142, 144, 146, and 148. Integrator 152 includes integrator stages 154, 156, 158, and 160.

Differentiater 140 includes a plurality of input terminals for receiving a digital word at an input data irate labeled "DIGITAL INPUT", and a plurality of output terminals for providing an output labeled "D" at a sample frequency of $f_s$. First up-sampler 150 has a plurality of input terminals connected to the output terminals of differentiator 140, and a plurality of output terminals for providing an output labeled "E" at a sample frequency of N*$f_s$, where N is a first up-sampling ratio. Integrator 152 has a plurality of input terminals connected to the output terminals of first up-sampler 150, and a plurality of output terminals for providing an output at the sample frequency of N*$f_s$. Scaler 162 has a plurality of input terminals connected to the output terminals of integrator 152, and a plurality of output terminals for providing an output labeled "F". Second up-sampler 164 has a plurality of input terminals connected to the output terminals of scaler 162, and a plurality of output terminals for providing an output at a data rate of M*N*$f_s$ labeled "G". Second up-sampler 164 up-samples at a second up-sample ratio M. Sigma delta D/A 166 has a plurality of input terminals connected to the output terminals of second up-sampler 164, and an output terminal for providing a output labeled "ANALOG OUTPUT" at the output data rate of M*N*$f_s$.

The operation of D/A converter 138 will now be described with reference to FIG. 3 and FIGS. 4–1 through 4—4. FIGS. 4–1 through 4—4 illustrate frequency domain waveforms of various signals in the D/A converter 138 of FIG. 3. FIG. 4–1 illustrates output D of differentiator 140. Note that differentiator 140 operates substantially the same as differentiator 100 illustrated in FIG. 1. First up-sampler 150 has a sample ratio of N and up-samples the output of differentiator 140. In the illustrated embodiment, N equals 5. Note that up-sampler 150 is a sample and hold, so the spectrum is multiplied by a sin(x)/x function, resulting in lower spectral energy out of the passband. The output E of first up-sampler 150 is illustrated in FIG. 4–2. The up-sample frequency rate will therefore be N multiplied by the sample frequency $f_s$.

Because N is equal to 5, the bit increase from the output of differentiator 140 to the input of integrator of 152 is equal to only 3 bits. The sample ratios N and M determine the bit width of the output of integrator 152 which has been predetermined to be 26 bits in the embodiment illustrated in FIG. 3. Also, the addition rate of the adders of integrator 152 is determined by the sample ratios N and M. The output of integrator 152 is being provided at a frequency equal to $f_s$ multiplied by N.

Figure 43:
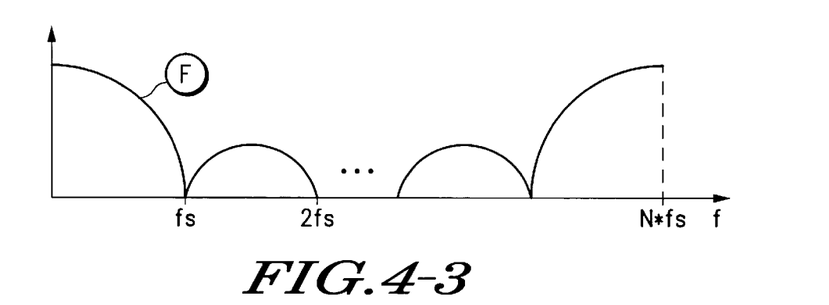
Figure 44:
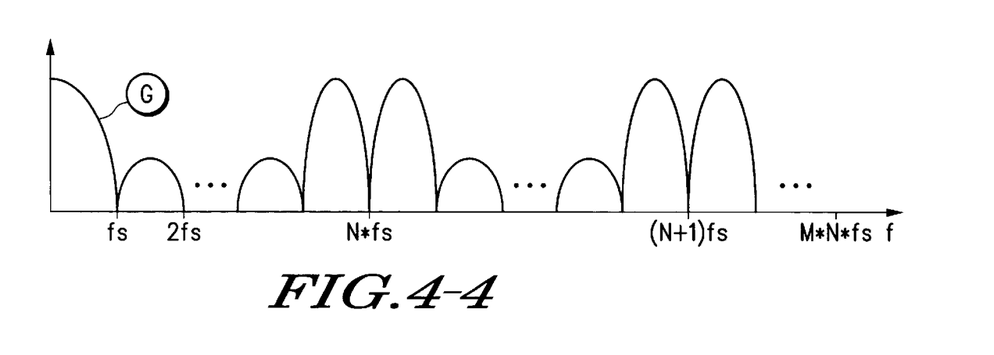

Scalar 162 functions to reduce the number of bits provided by integrator 152 from 26 to 16. The output of scalar 162 is provided to an input of second up-sampler 164. Second up-sampler 164 has a second up-sampling ratio of M. In the illustrated embodiment, M is equal to 40, so that the total sample rate of D/A converter 138 is M*N, or 200. Up-sampler 164 is a sample and hold also, so that the sin(x)/x multiplier will create zeros at multiples of N*$f_s$, greatly reducing out-of-band energy. The output of second up-sampler 164 is provided to an input of sigma delta D/A converter 166. The output F of scalar 162 is illustrated in FIG. 4–3. Likewise, the output of second up-sampler 164 is illustrated in FIG. 4—4. Up-samplers 150 and 164 also include sample-and-hold circuits. The sample-and-hold circuits provide additional filtering due to the well known sin(x)/x effect. The output of second up-sampler 164 is being provided at a frequency of M times N times $f_s$.

For purposes of understanding the advantages of D/A converter 138 over prior art D/A converter 99 illustrated in FIG. 1, since R equals 200 in FIG. 1, then M times N (M*N) in FIG. 3 is made equal to 200 to provide the same overall up-sampling. As illustrated in FIG. 3 and described above, in D/A converter 138 a portion of the up-sampling operation occurs after differentiator 140 and the balance of the up-sampling operation follows scalar 162. Since the transition band performance of the D/A converter 138 is not substantially adversely affected by decreasing the up-sample ratio that precedes the integrators, some of this up-sampling can be more efficiently performed after the integrators. This modification from the prior art allows roughly equivalent pass band and transition band performance, while allowing much smaller integrators that are clocked at a lower frequency. The balance of the necessary up-sampling ratio is introduced following scalar 162 to reduce the register width of integrator 152, while maintaining approximately the same interpolating function provided by prior art D/A converter 99. Integrator stage 160 only requires 26 bits while integrator stage 128 of the prior art CIC interpolation filter requires 47 bits. Decreasing the size of integrator 152 decreases size of the adders of integrator 152, thus decreasing the area and power consumption requirements of D/A converter 138, without noticeably affecting filtering performance in the transition band. Note that the passband band is illustrated in FIG. 4—4 to the left of frequency $f_s$.

Figure 5:
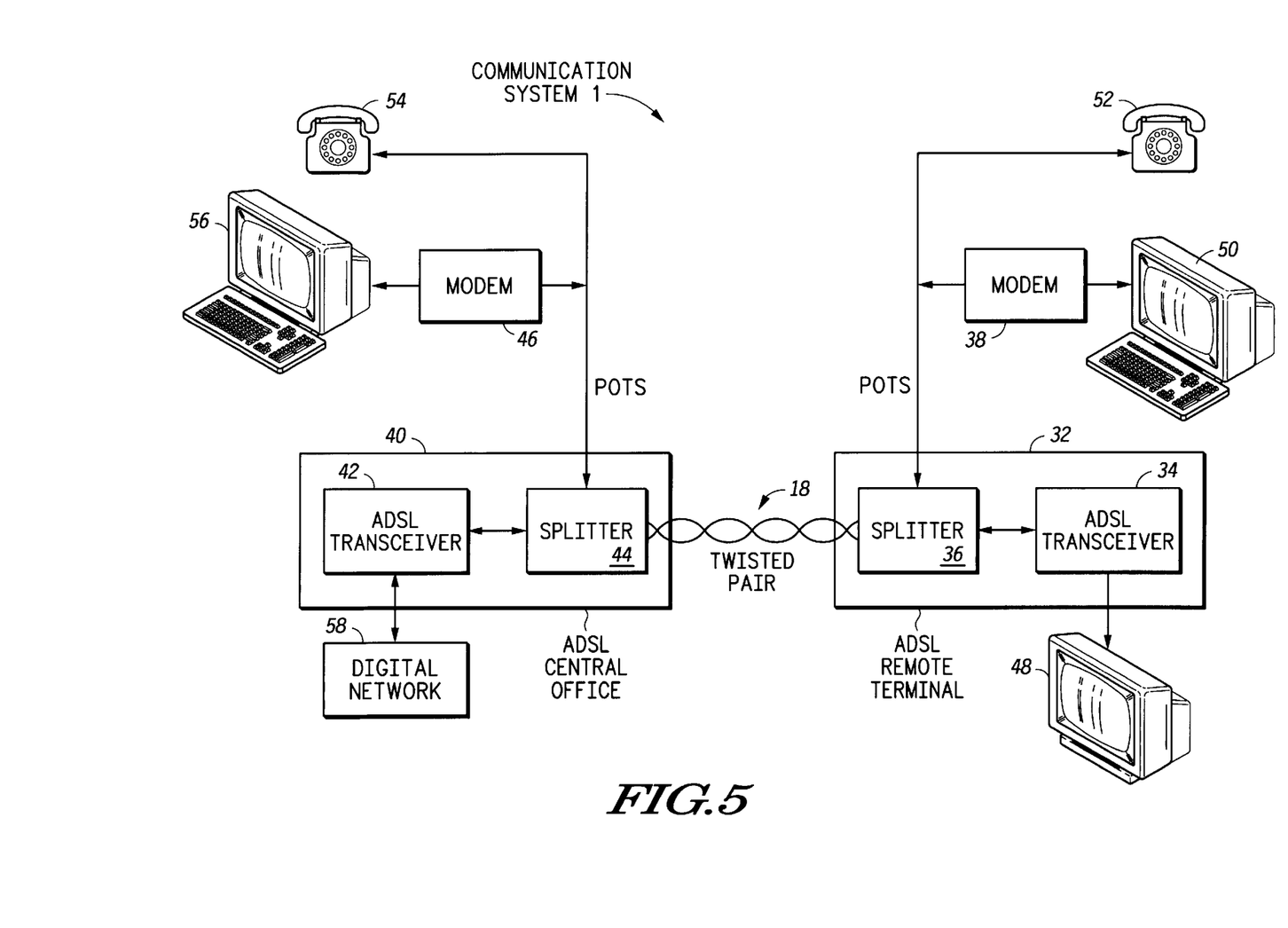
FIG. 5 illustrates a communication system as one application for the D/A converter of FIG. 3.

D/A converter 138 may be used in a number of applications. FIG. 5 illustrates a communication system 1, as one application for D/A converter 138. Communication system 1 having an Asymmetrical Digital Subscriber Line (ADSL) remote terminal 32 and an ADSL central office 40. ADSL central office 40 contains ADSL transceiver 12 and splitter 44. ADSL central office 40 is coupled to ADSL remote terminal 32 by way of twisted pair 18. ADSL remote terminal 32 includes splitter 36 and ADSL transceiver 34.

ADSL transceiver 42 is bi-directionally coupled to splitter 44, and is additionally bi-directionally coupled externally to digital network 58. ADSL transceiver 34 is bi-directionally coupled to splitter 36, and is additionally coupled to external devices 48. Splitter 44 is bi-directionally coupled to telephone 54, while splitter 36 is bi-directionally coupled to telephone 52. Splitter 44 is additionally coupled to modem 46 and splitter 36 is coupled to modem 38. Modem 38 is further coupled to external terminals 50 and modem 46 is coupled to external terminals 56.

Communication system 1 is an example of a digital communication network, where the digital network allows communication between a variety of users having computers, telephones, fax machines, modems, television sets, and any number of other communication devices. Digital network 58 is used to transmit such a variety of information, each of which has a different transmission format and frequency.

Figure 6:
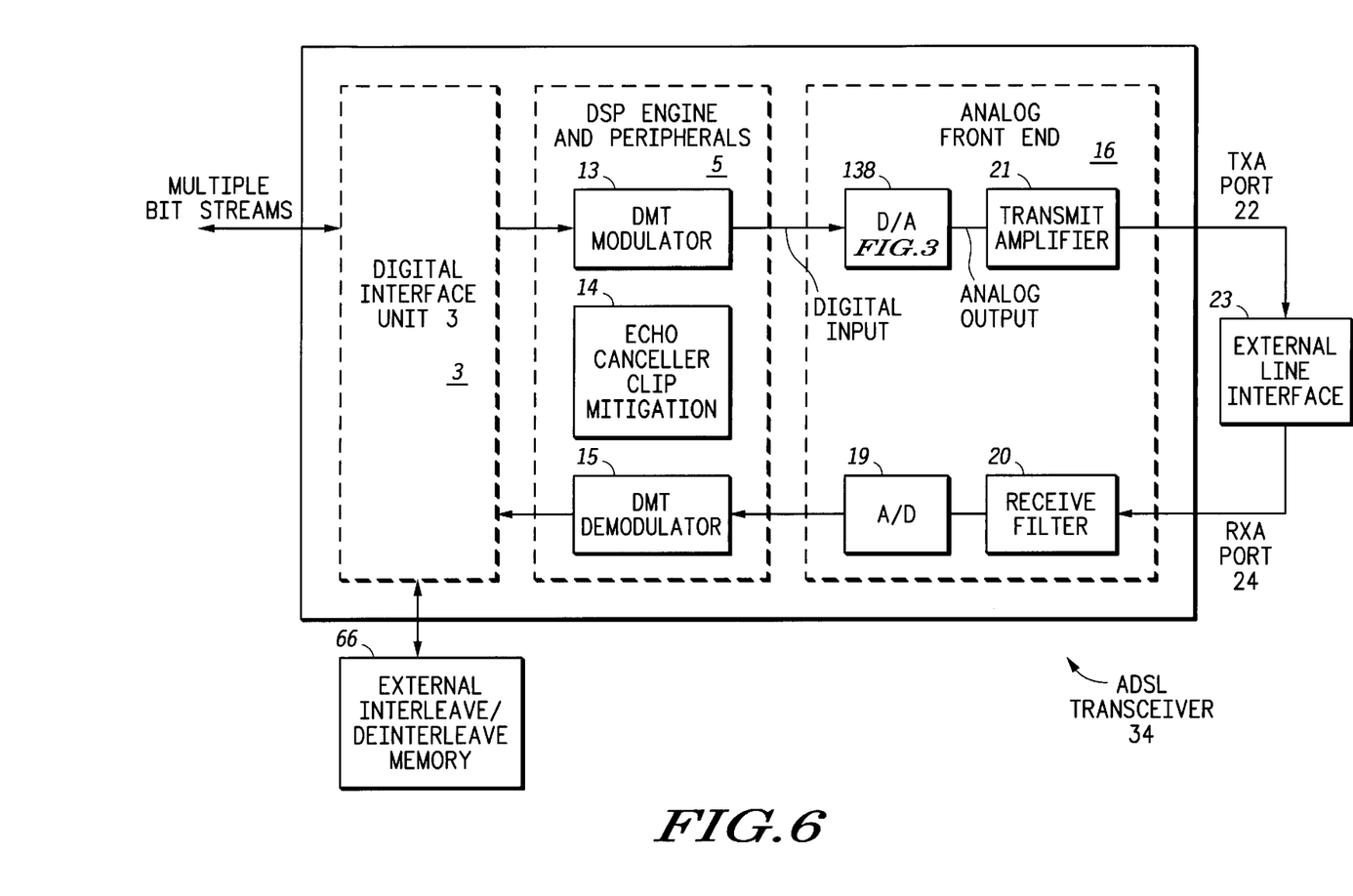
FIG. 6 illustrates the ADSL transceiver of FIG. 5 in more detail.
Figure 21:
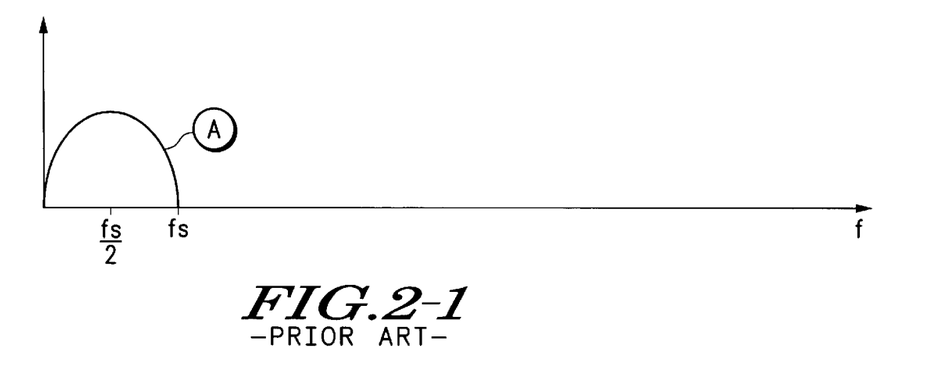
Figure 22:
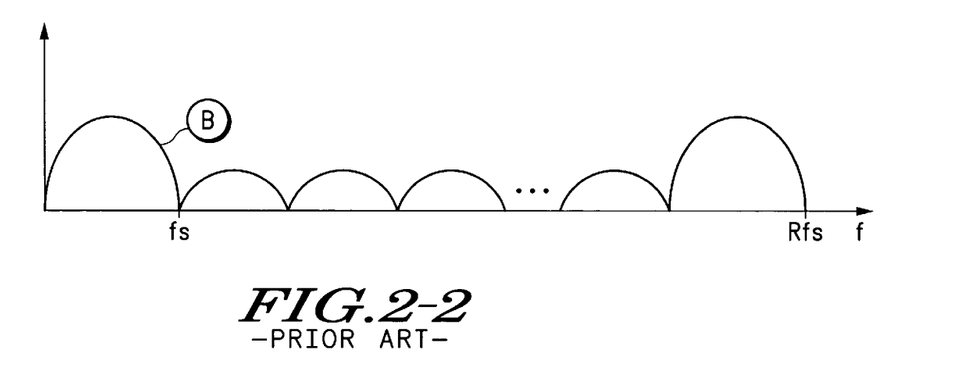

FIG. 6 illustrates ADSL transceiver 34 of FIG. 5, along with an external interleave/de-interleave memory 66. Here, ADSL transceiver 34 may be a single chip embodiment and is substantially the same as ADSL transceiver 42. Referring to FIG. 6, ADSL transceiver 34 includes digital interface unit 3, which is coupled to digital signal processing (DSP) engine and peripherals 5. Further, DSP engine and peripherals 5 is coupled to analog front end 16. The DSP engine performs data processing and provides DIGITAL INPUT to the D/A converter 138. Digital interface unit 3 is bi-directionally coupled to receive signals labeled "MULTIPLE BIT STREAMS", and is bi-directionally coupled to an external interleave/deinterleave memory 66.

Analog front end 16 contains analog/digital converter (A/D) 19 which is coupled to receive filter 20. Analog front end 16 further includes transmit amplifier 21 which is coupled to digital/analog converter (D/A) 138. Transmit amplifier 21 is further coupled to TXA port 22. Receive filter 20 is coupled to port 24. RXA port 22 is then coupled to external line interface 23. External line interface 23 is coupled to both ports 22 and 24.

DSP engine and peripherals 5 includes a digital signal processor and firmware necessary to perform various signal processing functions. These functions include a DMT modulator 13, an echo canceller clip mitigation 14, and a DMT demodulator. DMT modulator 13 has an input coupled to digital interface unit 3, and an output coupled to D/A converter 138. D/A converter 138 is illustrated in more detail in FIG. 3, and is discussed above. DMT demodulator 15 has an input coupled to A/D converter 19, and an output coupled to digital interface unit 3. Echo cancellation clip mitigation 14 is an additional signal processing function performed by DSP engine and peripherals 5, and these functions are performed on both the transmit and receive sides by subtracting echo terms of one path from the signal in the other path.

Digital interface unit 3 includes a bidirectional port for receiving and transmitting payload data, which is labeled "MULTIPLE BIT STREAMS" in FIG. 6. When receiving data for transmission, digital interface unit 3 receives transmit payload data from the MULTIPLE BIT STREAMS and outputs sets of complex symbols to DMT modulator 13. Similarly, digital interface unit 3 receives sets of complex symbols from DMT demodulator 15 and outputs receive payload data to the MULTIPLE BIT STREAMS. As part of the ADSL task, digital interface unit 3 also interleaves transmit data and de-interleaves receive data.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A cascaded integrator-comb interpolation filter, comprising;
   a differentiator that receives input data at a first data rate;
   a first up-sampler connected to the differentiator and a second data is higher than the first data rate;
   an integrator connected to the first up-sampler, hr receiving the data from sampler and operating at the second data rate; and
   a second up-sampler connected to the integrator and providing output data at a third data rate, the output data for being to provide a digital-to-analog converter, the digital-to-analog converter operation at a data rate that is higher than the second rate.

2. A cascaded integrator-comb interpolation filter according to claim 1, wherein the integrator comprises at least one adder of a predetermined bit width.

3. A cascaded integrator-comb interpolation filter according to claim 1, wherein a pass band to stop band transition region is a function of a first up-sampling ratio, wherein the first up-sampling ratio is a rating between the second data rate and the first data rate.

4. A cascaded integrator-comb interpolation filter according to claim 1, wherein stop band performance is a function of a second up-sampling ratio, and the second up-sampling ratio is a ratio between the third data rate and the second data rate.

5. A cascaded integrator-comb interpolation filter according to claim 2, wherein the at least one adder comprises four adders.

6. A cascaded integrator-comb interpolation filter according to claim 1, wherein the differentiator comprises at least one adder of a certain bit width.

7. A cascaded integrator-comb interpolation filter according to claim 6, wherein the at least one adder comprises four adders.

8. A cascaded integrator-comb interpolation filter according to claim 1, wherein the first up-sampling ratio is lower than the second up-sampling ratio.

9. A cascaded integrator-comb interpolation filter according to claim 1, wherein the second up-sampling ratio is greater than one.

10. A cascaded integrator-comb interpolation filter according to claim 1, wherein the differentiator receives digital data from a data processor.

11. A cascaded integrator-comb interpolation filter according to claim 1, wherein the first up-sampler and the second up-sampler each include a sample and hold function.

12. A cascaded integrator-comb interpolation filter according to claim 1, wherein the cascaded integrator-comb interpolation filter is within a transceiver, the transceiver comprising:
    a data processor providing digital data; and
    the digital-to-analog converter receives interpolated data;
    wherein the cascaded integrator-comb interpolation filter receives the digital data and outputs the interpolated data from the second up-sampler.

13. A cascaded integrator-comb interpolation filter according to claim 1, wherein the digital-to-analog converter is a sigma-delta converter.

14. A signal processing circuit, comprising:
    a filter circuit for receiving input data at a first data rate and for performing a filtering function on the input data to produce filtered input data;

an up-sampling circuit, coupled to the filter circuit, for receiving the filtered input data and for producing output data at a second data rate; and a digital-to-analog converter, connected to the up-sampling circuit, the digital-to-analog converter operating at a third data rate, wherein the third data rate is faster than the second data rate.

15. A cascaded integrator-comb interpolation filter having an up-sampling ratio equal to the ratio of an output data rate to an input data rate, comprising:

a differentiator having an input for receiving input data at the input data rate, and an output;

a first up-sampler having an input connected to the output of the differentiator and an output producing data with a first up-sampling ratio;

an integrator receiving the data produced by the first up-sampler at an input, and having an output; and a second up-sampler having an input connected to the output of the integrator and an output producing output data with a second up-sampling ratio;

wherein the up-sampling ratio of the cascaded integrator-comb interpolation filter equals the first up-sampling ratio multiplied by the second up-sampling ratio, and wherein the output data is provided to digital-to-analog converter that is operating at the input data multiplied by the up-sampling ratio.

16. A cascaded integrator-comb interpolation filter according to claim 15, wherein the integrator comprises at least one adder of a certain bit width.

17. A cascaded integrator-comb interpolation filter according to claim 15, wherein a pass band to stop function of the first up-sampling ratio.

18. A cascaded integrator-comb interpolation filter according to claim 15, wherein stop band performance, is a function of the second up-sampling ratio.

19. A cascaded integrator-comb interpolation filter according to claim 16, wherein the at least one adder comprises four adders.

20. A cascaded integrator-comb interpolation filter according to claim 15, wherein the differentiator comprises at least one adder of a certain bit width.

21. A cascaded integrator-comb interpolation filter according to claim 20, wherein the at least one adder comprises four adders.

22. A cascaded integrator-comb interpolation filter according to claim 15, wherein the second up-sampler comprises a sample and hold function.

23. A cascaded integrator-comb interpolation filter according to claim 15, wherein the first up-sampling ratio is lower than the second up-sampling ratio.

24. A cascaded integrator-comb interpolation filter according to claim 15, wherein the second up-sampling ratio is greater than one.

25. A cascaded integrator-comb interpolation filter according to claim 15, wherein the differentiator receives digital data from a data processor.

26. A cascaded integrator-comb interpolation filter according to claim 15, wherein the cascaded integrator-comb interpolation filter is within a transceiver comprising:

a data processor providing digital data; and be digital-to-analog converter receives interpolated data;

wherein the cascaded integrator-comb interpolation filter receives the digital data and outputs the interpolated data from the second up-sampler.

27. A cascaded integrator-comb interpolation filter according to claim a wherein the digital-to-analog converter is a sigma-delta converter.

* * * * *